United States Patent …

(12) United States Patent
Xie et al.

(10) Patent No.: US 10,447,218 B1
(45) Date of Patent: Oct. 15, 2019

(54) HYBRID DIFFERENTIAL AMPLIFIER AND METHOD THEREOF

(71) Applicant: Realtek Semiconductor Corp., Hsinchu (TW)

(72) Inventors: Juan Xie, San Jose, CA (US); Poh Boon Leong, Pleasanton, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/035,897

(22) Filed: Jul. 16, 2018

(51) Int. Cl.
*H03F 3/45* (2006.01)
*H03F 1/22* (2006.01)
*H03F 3/193* (2006.01)
*G05F 3/16* (2006.01)

(52) U.S. Cl.
CPC ........... *H03F 3/45179* (2013.01); *G05F 3/16* (2013.01); *H03F 1/223* (2013.01); *H03F 3/193* (2013.01)

(58) Field of Classification Search
CPC ........................................................ H03F 3/45
USPC ................................................. 330/253, 261
See application file for complete search history.

(56) References Cited

U.S. PATENT DOCUMENTS

| | | | | |
|---|---|---|---|---|
| 7,671,686 B2* | 3/2010 | Kuo | ........................... | H03F 3/19 330/253 |
| 8,704,597 B2* | 4/2014 | Yu | ........................ | H03F 3/45188 330/253 |
| 8,816,771 B2* | 8/2014 | Chen | ........................ | H03F 1/223 330/253 |
| 9,246,451 B2 | 1/2016 | Sutardja et al. | | |
| 9,964,985 B1 | 5/2018 | Leong | | |
| 2006/0170502 A1* | 8/2006 | Cha | .......................... | H03F 1/223 330/295 |
| 2013/0063210 A1* | 3/2013 | Corsi | ...................... | H03F 1/223 330/253 |
| 2016/0072449 A1* | 3/2016 | Tajalli | ................... | H03F 1/0205 330/253 |

OTHER PUBLICATIONS

U.S. Appl. No. 15/446,043, filed Mar. 1, 2017.

* cited by examiner

*Primary Examiner* — Henry Choe
(74) *Attorney, Agent, or Firm* — McClure, Qualey & Rodack, LLP

(57) ABSTRACT

An apparatus includes a first common-source amplifier having a first PMOS (p-channel metal oxide semiconductor) transistor configured to receive a first voltage and output a first current; a second common-source amplifier having a first NMOS (n-channel metal oxide semiconductor) transistor configured to receive a second voltage and output a second current, wherein the first common-source amplifier and the second common-source amplifier share a common source node, and an AC (alternating current) component of the first voltage is an inversion of an AC component of the second voltage; a first common-gate amplifier having a second PMOS transistor configured to receive the first current and output a third current; a second common-gate amplifier having a second NMOS transistor configured to receive the second current and output a fourth current; and a load configured to terminate the third current and the fourth current.

13 Claims, 6 Drawing Sheets

HYBRID DIFFERENTIAL AMPLIFIER AND METHOD THEREOF

BACKGROUND OF THE INVENTION

Field of the Invention

The present invention generally relates to differential amplifier circuits, and more particularly one that can alleviate the adverse effect of the ground bounce and source degeneration.

Description of Related Art

As depicted in FIG. 1, a conventional differential amplifier 100 comprises a core circuit 110 and a load 130. The core circuit 110 comprises a differential pair 111 and a cascode pair 112. The differential pair 111 comprises a first NMOS (n-channel metal oxide semiconductor) transistor 111A and a second NMOS transistor 111B configured to receive an input signal comprising a first end $V_{IP}$ and a second end $V_{IN}$ and output a first current $I_{1a}$ and a second current $I_{1b}$, while the cascode pair 112 comprises a third NMOS transistor 112A and a fourth NMOS transistor 112B configured to receive the first current $I_{1a}$ and the second current $I_{1b}$ and output a third current $I_{1c}$ and a fourth current $I_{1d}$. The load 130 comprises a first inductor 131 and a second inductor 132 configured to provide termination to the third current $I_{1c}$ and the fourth current $I_{1d}$ and establish an output signal comprising a first end $V_{ON}$ and a second end $V_{OP}$. Throughout this disclosure, "$V_{DD}$" denotes a first DC (direct current) node referred to as a power node, and "$V_{SS}$" denotes a second DC node referred to as a ground node. In FIG. 1, "$V_{BC}$" denotes a DC node that provides a bias voltage for NMOS transistors 112A and 112B of the cascode pair 112. Conventional differential amplifier 100 is well known by those of ordinary skills in the art and thus not described in detail here. Mathematically, $V_{1P}$ and $V_{IN}$ can be expressed by $$V_{IP} = V_{BI} + v_{in}(t) \quad (1)$$

$$V_{IN} = V_{BI} - v_{in}(t) \quad (2)$$

Here, $V_{BI}$ is DC (direct current) component of $V_{IP}$ and $V_{IN}$ that establishes a bias voltage for NMOS transistors 111A and 111B, and $v_{in}(t)$ represents an AC (alternating current) signal as a function of time t.

An issue with the conventional differential amplifier 100 is: when $v_{in}(t)$ is large, there is a large AC current flowing into the ground node "$V_{SS}$." Ideally, the ground node "$V_{SS}$" has zero impedance and thus will not be perturbed by the large AC current. In practice, however, the ground node "$V_{SS}$" has nonzero impedance, resulting in a "ground bounce" and a "source degeneration" that can reduce a gain of the differential pair 111 and thus degrade a performance aspect of the differential amplifier 100.

What is desired is a differential amplifier that can alleviate the adverse effect of the ground bounce and source degeneration.

BRIEF SUMMARY OF THIS INVENTION

In an embodiment, an apparatus comprises: a first common-source amplifier comprising a first PMOS (p-channel metal oxide semiconductor) transistor configured to receive a first voltage and output a first current; a second common-source amplifier comprising a first NMOS (n-channel metal oxide semiconductor) transistor configured to receive a second voltage and output a second current, wherein the first common-source amplifier and the second common-source amplifier share a common source node, and an AC (alternating current) component of the first voltage is an inversion of an AC component of the second voltage; a first common-gate amplifier comprising a second PMOS transistor configured to receive the first current and output a third current; a second common-gate amplifier comprising a second NMOS transistor configured to receive the second current and output a fourth current; and a load configured to terminate the third current and the fourth current.

In an embodiment, an apparatus comprises: a first hybrid differential amplifier configured to receive a first input signal and a second input signal and output a first output signal and a second output signal using a first cascode amplifier and a second cascode amplifier, respectively; and a second hybrid differential amplifier configured to receive a third input signal and a fourth input signal and output a third output signal and a fourth output signal using a third cascode amplifier and a fourth cascode amplifier, respectively; wherein: the first cascode amplifier and the third cascode amplifier are based on using PMOS (p-channel metal oxide semiconductor) transistors, the second cascode amplifier and the fourth cascode amplifier are based on using NMOS (n-channel metal oxide semiconductor) transistors, a DC (direct current) component of the first input signal is the same as a DC component of the third input signal, a DC component of the second input signal is the same as a DC component of the fourth input signal, an AC (alternating current) component of the first input signal is the same as an AC component of the fourth input signal, an AC component of the second input signal is the same as an AC component of the third input signal, and the AC component of the second input signal is an inversion of the AC component of the first input signal.

In an embodiment, a method comprises: receiving a first voltage and a second voltage, wherein an AC (alternating current) component of the first voltage is an inversion of an AC component of the second voltage; converting the first voltage into a first current using a first common-source amplifier comprising a first PMOS (p-channel metal oxide semiconductor) transistor; converting the second voltage into a second current using a second common-source amplifier comprising a first NMOS (n-channel metal oxide semiconductor) transistor, wherein the first common-source amplifier and the second common-source amplifier share a common source node; relaying the first current into a third current using a first common-gate amplifier comprising a second PMOS transistor; relaying the second current into a fourth current using a second common-gate amplifier comprising a second NMOS transistor; and terminating the third current and the fourth current with a load.

DETAILED DESCRIPTION OF THIS INVENTION

The present invention relates to differential amplifiers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "voltage," "current," "signal," "differential signal," "common mode," "capacitor," "inductor," "resistor," "transistor," "MOS (metal-oxide semiconductor)," "PMOS (p-channel metal oxide semiconductor)," "NMOS (n-channel metal oxide semiconductor)," "AC (alternating current)," "DC (direct current)," "DC-coupled," "AC coupled," "source," "gate," "drain," "node," "ground node," "power node," "cascode," "common-source amplifier," "common-gate amplifier," and "cascode amplifier." Those of ordinary skill in the art can also readily recognize a symbol of a MOS transistor, and its associated "source," "gate," and "drain" terminals. Terms and basic concepts like these are apparent to those of ordinary skill in the art and thus will not be explained in detail here.

Throughout this disclosure, "DC" stands for direct current, and "AC" stands for alternating current. A DC node is a node of a substantially fixed electric potential. In particular, "$V_{DD}$" denotes a first DC node referred to as a power node, and "$V_{SS}$" denotes a second DC node referred to as a ground node. As well, a differential signal is a composite signal that comprises a first constituent signal and a second constituent signal. The first constituent signal is often referred to as a first end, while the second constituent signal is often referred to as a second end.

Figure 2A:
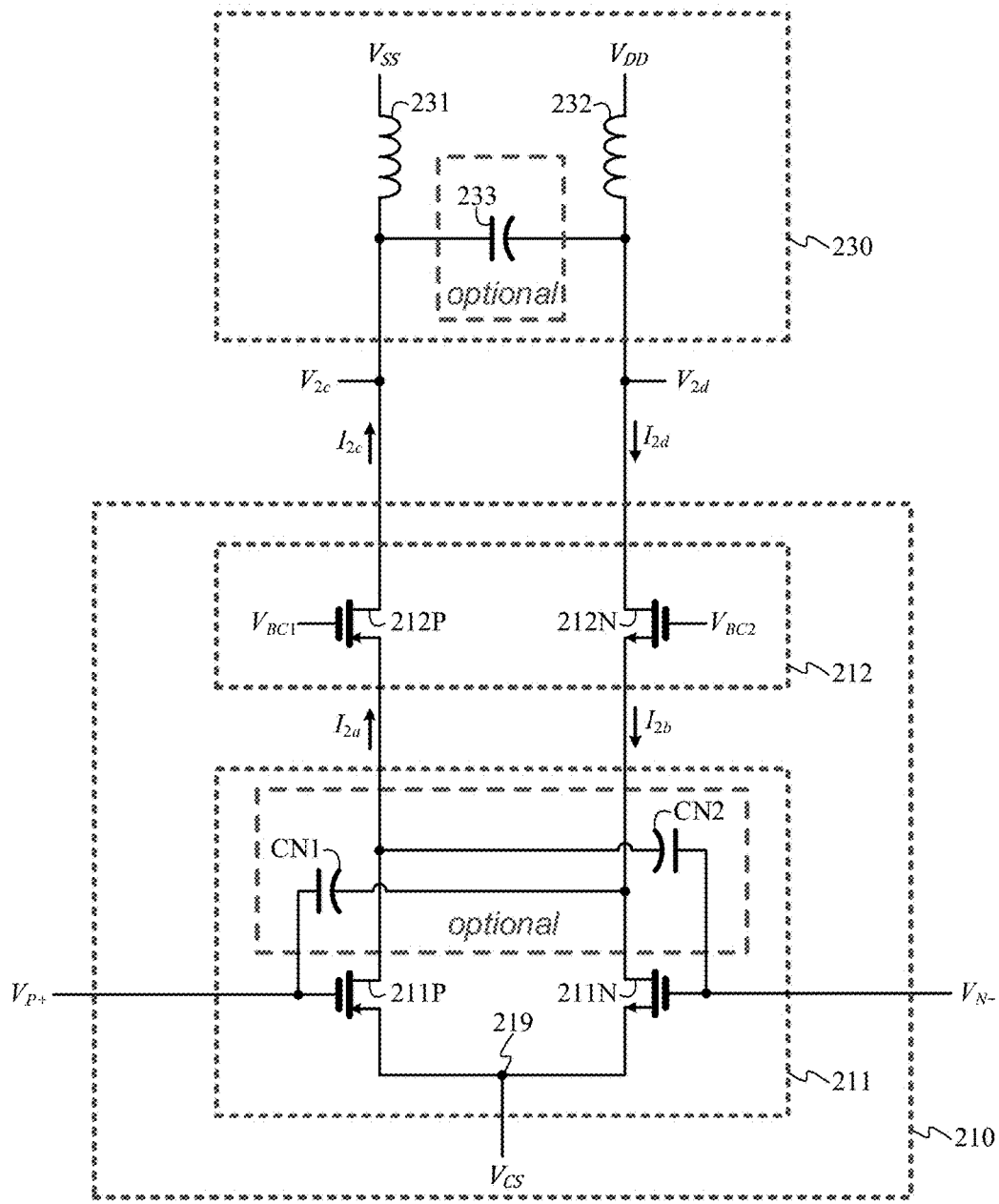
FIG. 2A shows a schematic diagram of a hybrid differential amplifier in accordance with an embodiment of the present invention.

A schematic diagram of a hybrid differential amplifier 200A, in accordance with an embodiment of the present invention, is shown in FIG. 2A. Hybrid differential amplifier 200A comprises a core circuit 210 and a load 230. The core circuit 210 comprises a hybrid differential pair 211 and a hybrid cascode pair 212. The hybrid differential pair 211 comprises a first PMOS transistor 211P and a first NMOS transistor 211N embodying a pair of common-source amplifiers configured to receive an input signal comprising a first end $V_{P+}$ and a second end $V_{N-}$ and output a first current $I_{2a}$ and a second current $I_{2b}$. In an optional embodiment, the hybrid differential pair 211 further comprise a first neutralization capacitor CN1 configured to couple the gate of the first PMOS transistor 211P to the drain of the first NMOS transistor 211N, and a second neutralization capacitor CN2 configured to couple the gate of the first NMOS transistor 211N to the drain of the first PMOS transistor 211P. Neutralization capacitors CN1 and CN2 can alleviate a Miller effect of hybrid differential pair 211. The Miller effect is well known to those of ordinary skill in the art and thus is not described herein.

The cascode pair 212 comprises a second PMOS transistor 212P and a second NMOS transistor 212N embodying a pair of common-gate amplifiers configured to receive the first current $I_{2d}$ and the second current $I_{2b}$ and output a third current $I_{2c}$ and a fourth current $I_{2d}$, respectively. From another perspective, the first PMOS transistor 211P and the second PMOS transistor 212P form a first cascode amplifier configured to receive $V_{P+}$ and output $I_{2c}$, while the first NMOS transistor 211N and the second NMOS transistor 212N form a second cascode amplifier configured to receive $V_{N-}$ and output $I_{2d}$. The load 230 comprises a first inductor 231 and a second inductor 232 configured to provide termination to the third current $I_{2c}$ and the fourth current $I_{2d}$ and establish an output signal comprising a first end $V_{2c}$ and a second end $V_{2d}$. In an optional embodiment, the load 230 further includes a tuning capacitor 233 configured to tune an impedance of the load 230. In FIG. 2A, "$V_{BC1}$" denotes a bias voltage for PMOS transistors 212P and "$V_{BC2}$" denotes a bias voltage for NMOS transistors 212N. Mathematically, $V_{P+}$ and $V_{N-}$ can be expressed by $$V_{P+}=V_{BP}+v_{in}(t) \tag{3}$$

$$V_{N-}=V_{BN}-v_{in}(t) \tag{4}$$

Figure 1:
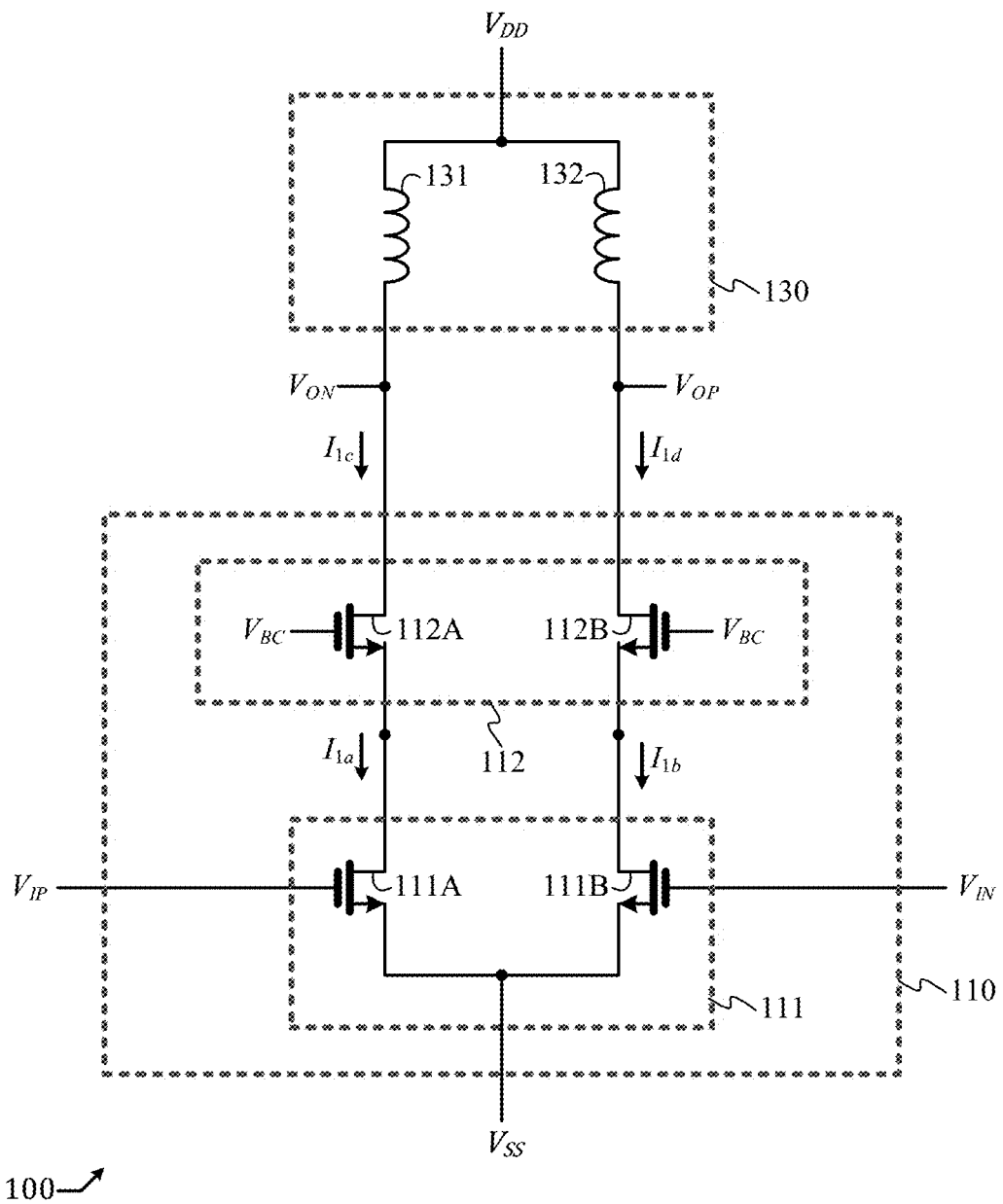
FIG. 1 shows a schematic diagram of a conventional differential amplifier.

Here, $V_{BP}$ is a DC component of $V_{P+}$ that establishes a biasing for PMOS transistor 211P, $V_{BN}$ is a DC component of $V_{N-}$ that establishes a biasing for NMOS transistor 211N, and $v_{in}(t)$ represents an AC (alternating current) signal as a function of time t. Although $V_{P+}$ and $V_{N-}$ have different DC components, they have the same AC component except for a polarity inversion. As far as the AC component is concerned, $V_{P+}$ and $V_{N-}$ form a differential signal. Functionally, hybrid differential amplifier 200A and conventional differential amplifier 100 are the same, as far as the AC component is concerned. However, instead of using devices of the same type to amplify a differential signal, hybrid differential amplifier 200A uses devices of different types: PMOS transistors 211P and 212P are used to amplify $V_{P+}$, while NMOS transistors 211N and 212N are used to amplify $V_{N-}$. Provided the first cascode amplifier (comprising PMOS transistors 211P and 212P) and the second cascode amplifier (comprising NMOS transistors 211N and 212N) are properly sized and biased to have substantially equal transconductance, the first current $I_{2a}$ will be substantially equal to the second current $I_{2b}$, and the voltage $V_{CS}$ at the common source node 219 can be substantially fixed even though $V_{P+}$ and $V_{N-}$ vary with $v_{in}(t)$. Therefore, a large $v_{in}(t)$ does not lead to a substantial "source degeneration" to PMOS transistor 211P and NMOS transistor 211N. Therefore, hybrid differential amplifier 200A is by nature superior to the conventional differential amplifier 100 of FIG. 1 in that regard.

Figure 2B:
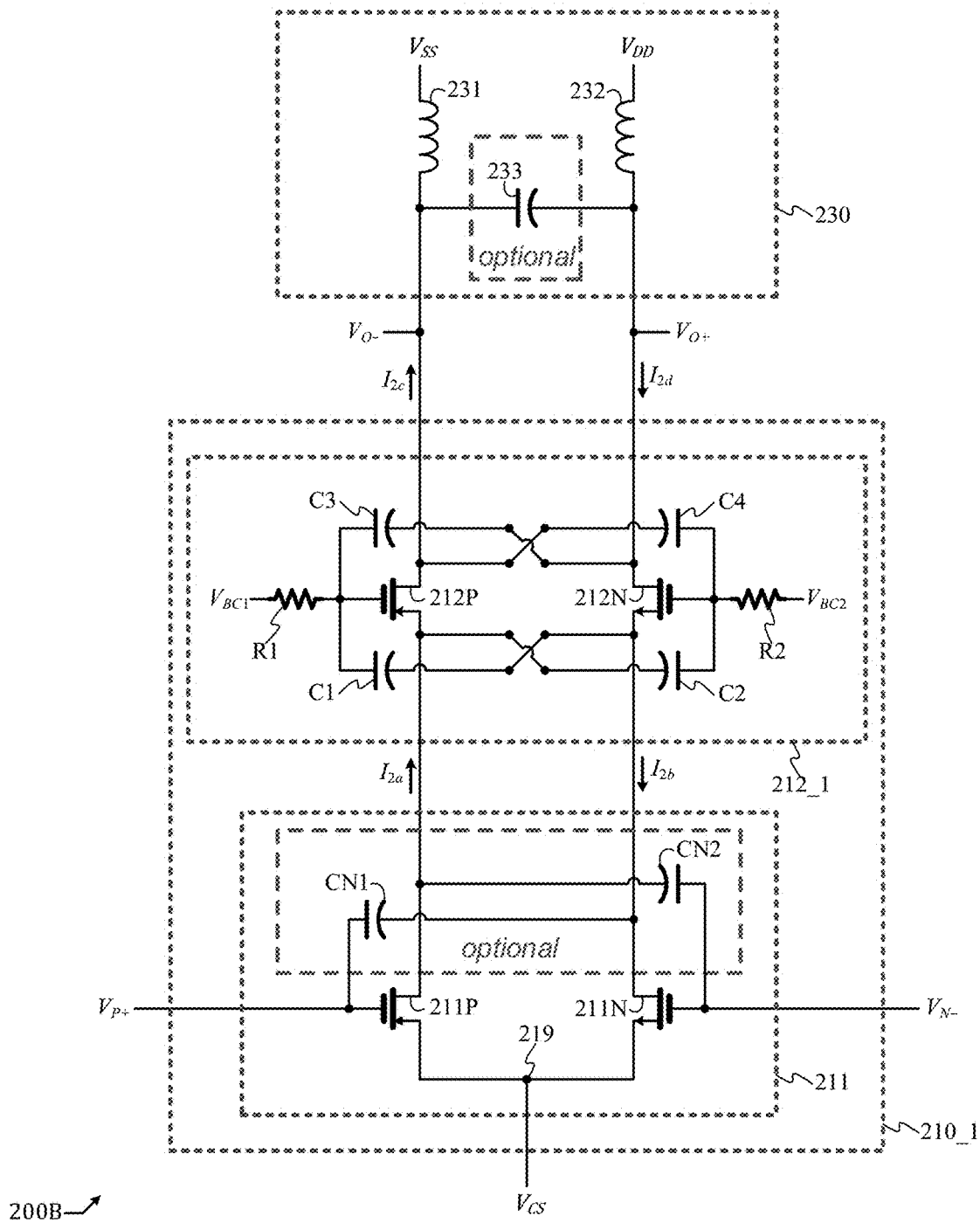
FIG. 2B shows a schematic diagram of a hybrid differential amplifier in accordance with an alternative embodiment of the present invention.

FIG. 2B shows a schematic diagram of a hybrid differential amplifier 200B in accordance with an alternative embodiment of the present invention. Hybrid differential amplifier 200B of FIG. 2B is the same as hybrid differential amplifier 200A of FIG. 2A except that the core circuit 210 in FIG. 2A is replaced by an alternative core circuit 210_1 in FIG. 2B, which is the same as the core circuit 210 in FIG. 2A except that the hybrid cascode pair 212 in the core circuit 210 is replaced by an alternative hybrid cascode pair 212_1 in the alternative core circuit 210_1. The hybrid cascode pair 212_1 is the same as the hybrid cascode pair 212 except that the sources and gates of PMOS transistor 212P and NMOS transistor 212N are cross coupled via a first capacitor C1 and a second capacitor C2, while the drains and gates of PMOS transistor 212P and NMOS transistor 212N are cross coupled via a third capacitor C3 and a fourth capacitor C4. More specifically, the source of NMOS transistor 212N is coupled to the gate of PMOS transistor 212P via capacitor C1; the source of PMOS transistor 212P is coupled to the gate of NMOS transistor 212N via capacitor C2; the drain of NMOS transistor 212N is coupled to the gate of the PMOS transistor 212P via capacitor C3; and the drain of PMOS transistor 212P is coupled to the gate of NMOS transistor 212N via capacitor C4. Besides, a first resistor R1 is inserted between the gate of PMOS transistor 212P and "$V_{BC1}$," and a second resistor R2 is inserted between the gate of NMOS transistor 212N and "$V_{BC2}$".

This arrangement makes the biasing condition of the alternative hybrid differential amplifier 200B the same as that of the hybrid differential amplifier 200A. The cross-coupling of sources and gates between the PMOS transistor 212P and the NMOS transistor 212N via capacitors C1 and C2 can provide a first positive feedback that can effectively enhance a gain of the hybrid differential amplifier 200B. The cross-coupling of drains and gates between the PMOS transistor 212P and the NMOS transistor 212N via capacitors C3 and C4 can provide a second positive feedback that can also effectively enhance a gain of the hybrid differential amplifier 200B. In fact, the second positive feedback tends to be stronger and more effective than the first positive feedback, since a voltage signal at a drain tends to be stronger than a voltage signal at a source of a MOS transistor, and this applies to PMOS transistor 212P and NMOS transistor 212N. However, the second positive feedback may potentially lead to instability due to having a high gain and thus must be used with caution. In another embodiment, capacitors C3 and C4 are removed; that is, the second positive feedback is not used.

Figure 3:
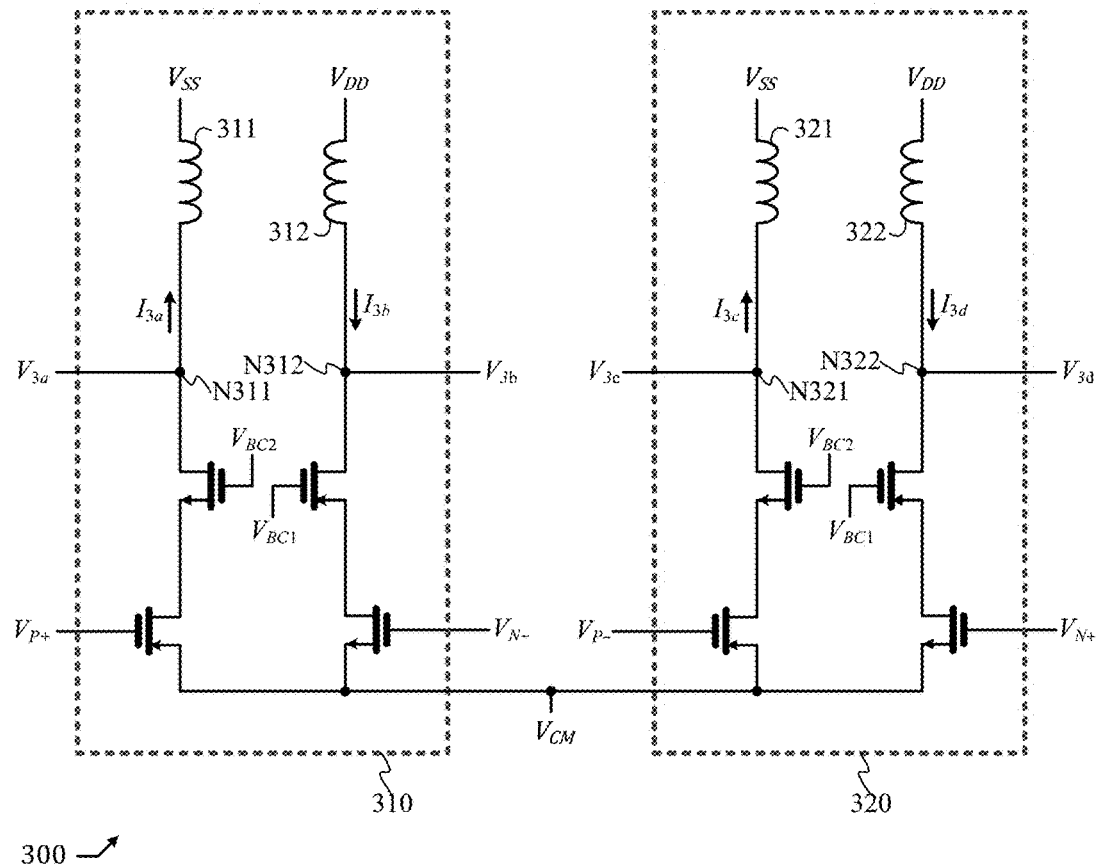
FIG. 3 shows a schematic diagram of a complementary hybrid differential amplifier in accordance with an embodiment of the present invention

A schematic diagram of a complementary hybrid differential amplifier 300 in accordance with an embodiment of the present invention is depicted in FIG. 3. The complementary hybrid differential amplifier 300 comprises a first hybrid differential amplifier 310 and a second hybrid differential amplifier 320. The first hybrid differential amplifier 310 is the same as the hybrid differential amplifier 200A in FIG. 2A. (Note that the optional embodiments including capacitors 233, CN1, and CN2 in FIG. 2A are not explicitly shown in FIG. 3 for brevity, but they can be applied at the discretion of circuit designers.) The second hybrid differential amplifier 320 is the same as the first hybrid differential amplifier 310, except that the inputs to the second hybrid differential amplifier 320 are $V_{P-}$ and $V_{N+}$, instead of $V_{P+}$ and $V_{N-}$, wherein $$V_{P-}=V_{BP}-v_{in}(t) \quad (5)$$

$$V_{N+}=V_{BN}+v_{in}(t) \quad (6)$$

This way, the inputs to the second hybrid differential amplifier 320 are complementary to the inputs to the first hybrid differential amplifier 310. The common-source nodes of the two hybrid differential amplifiers 310 and 320 are tied together, resulting in a common source voltage $V_{CM}$. The first hybrid differential amplifier 310 has two inductors labeled as 311 and 312; the second hybrid differential amplifier 320 has two inductors labeled as 321 and 322; $V_{3a}$ and $V_{3b}$ denote voltages at output nodes N311 and N312, respectively, of the first hybrid differential amplifier 310; $V_{3c}$ and $V_{3d}$ denote voltages at output nodes N321 and N322, respectively, of the second hybrid differential amplifier 320; $I_{3a}$ and $I_{3b}$ denote currents of inductors 311 and 312, respectively; and $I_{3c}$ and $I_{3d}$ denote currents of inductors 321 and 322, respectively.

In an alternative embodiment not explicitly shown in figure but clear to those of ordinary skills in the art, the two hybrid differential amplifiers 310 and 320 are both replaced by the hybrid differential amplifier 200B in FIG. 2B; that is, a positive feedback is used to enhance a gain.

Figure 4A:
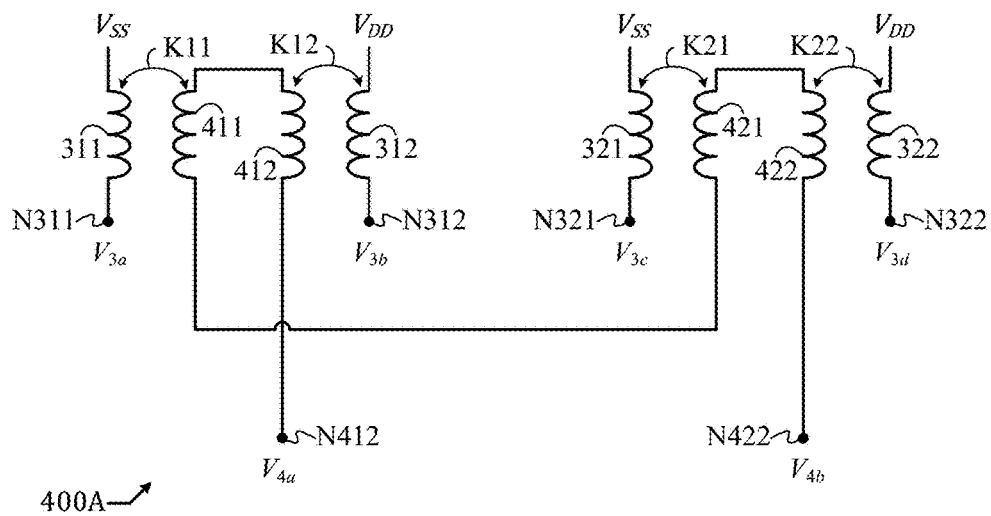
FIG. 4A shows a schematic diagram of a power combining network.

Outputs of the first hybrid differential amplifier 310 (i.e. $V_{3a}$ and $V_{3b}$, or $I_{3a}$ and $I_{3b}$) and outputs of the second hybrid differential amplifiers 320 (i.e. $V_{3c}$ and $V_{3d}$, or $I_{3c}$ and $I_{3d}$) can be combined using a power combining network 400A shown in FIG. 4A. Power combining network 400A comprises: inductor 411 configured to have an inductive coupling K11 with inductor 311; inductor 412 configured to have an inductive coupling K12 with inductor 312; inductor 421 configured to have an inductive coupling K21 with inductor 321; and inductor 422 configured to have an inductive coupling K22 with inductor 322. Inductors 411, 412, 421, and 422 are connected in a manner so that their respective voltages coupled from inductors 311, 312, 321, and 322 can be effectively summed, resulting in voltages $V_{4a}$ and $V_{4b}$ at nodes N412 and N422, respectively, that can represent a sum of $V_{3a}$, $V_{3b}$, $V_{3c}$, and $V_{3d}$. By way of example for explanation purpose: inductors 311, 312, 321, 322, 411, 412, 421, and 422 all have the same inductance, and the inductive couplings K11, K12, K21, and K22 all have a coupling coefficient that is approximately unity, then we have $$V_{4a}-V_{4b}=V_{3b}-V_{3a}+V_{3c}-V_{3d} \quad (7)$$

Note that $V_{3b}-V_{3a}$ represents an output of the first hybrid differential amplifier 310, and $V_{3c}-V_{3d}$ represents an output of the second hybrid differential amplifier 320, therefore $V_{4a}-V_{4b}$ represents a sum of outputs of the two hybrid differential amplifiers 310 and 320.

Figure 4B:
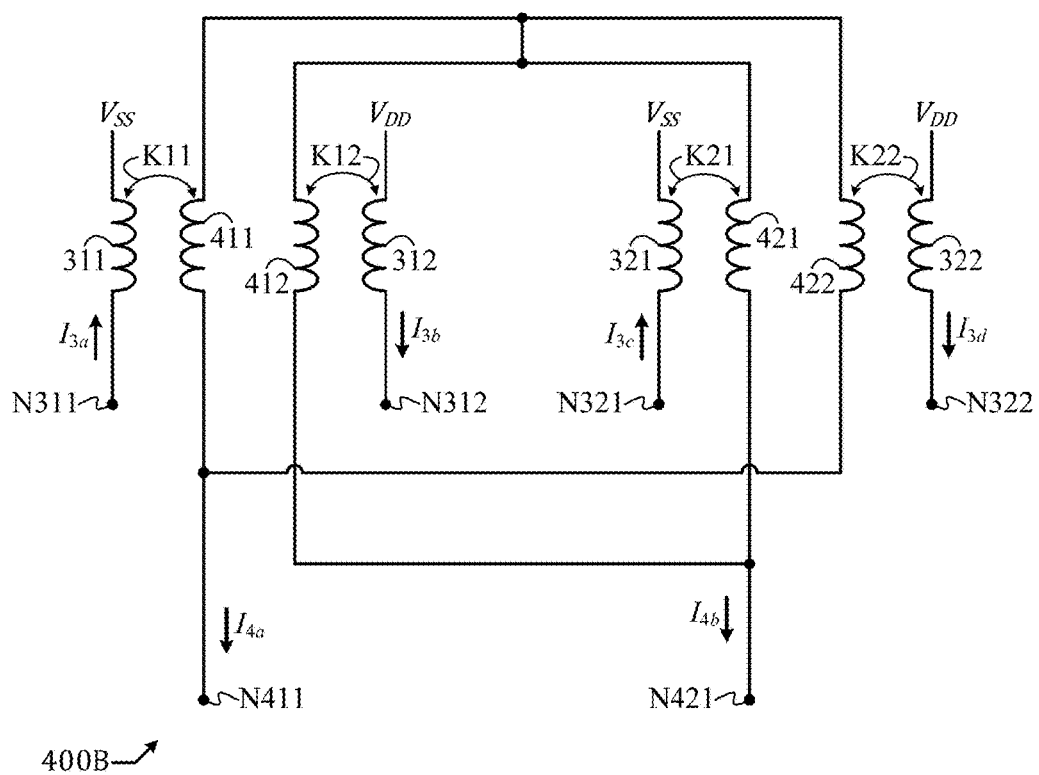
FIG. 4B shows a schematic diagram of another power combining network.

In an alternative embodiment shown in FIG. 4B, inductors 411, 412, 421, and 422 are connected in a manner so that their respective currents coupled from inductors 311, 312, 321, and 322 can be effectively summed, resulting in currents $I_{4a}$ and $I_{4b}$ output to nodes N411 and N421, respectively, that can represent a sum of $I_{3a}$, $I_{3b}$, $I_{3c}$ and $I_{3d}$. Under the same condition stated earlier (i.e. inductors 311, 312, 321, 322, 411, 412, 421, and 422 all have the same inductance, and the inductive couplings K11, K12, K21, and K22 all have a coupling coefficient that is approximately unity), we have $$I_{4a}-I_{4b}=I_{3a}+I_{3b}-I_{3c}-I_{3d} \quad (8)$$

Note that $I_{3a}+I_{3b}$ represents an output of the first hybrid differential amplifier 310, and $I_{3d}$ represents an output of the second hybrid differential amplifier 320, therefore $I_{4a}-I_{4b}$ represents a sum of outputs of the two hybrid differential amplifiers 310 and 320.

In comparison, power combining network 400A of FIG. 4A is favorable for generating a high output voltage, while power combining network 400B of FIG. 4B is favorable for generating a high output current.

Figure 5:
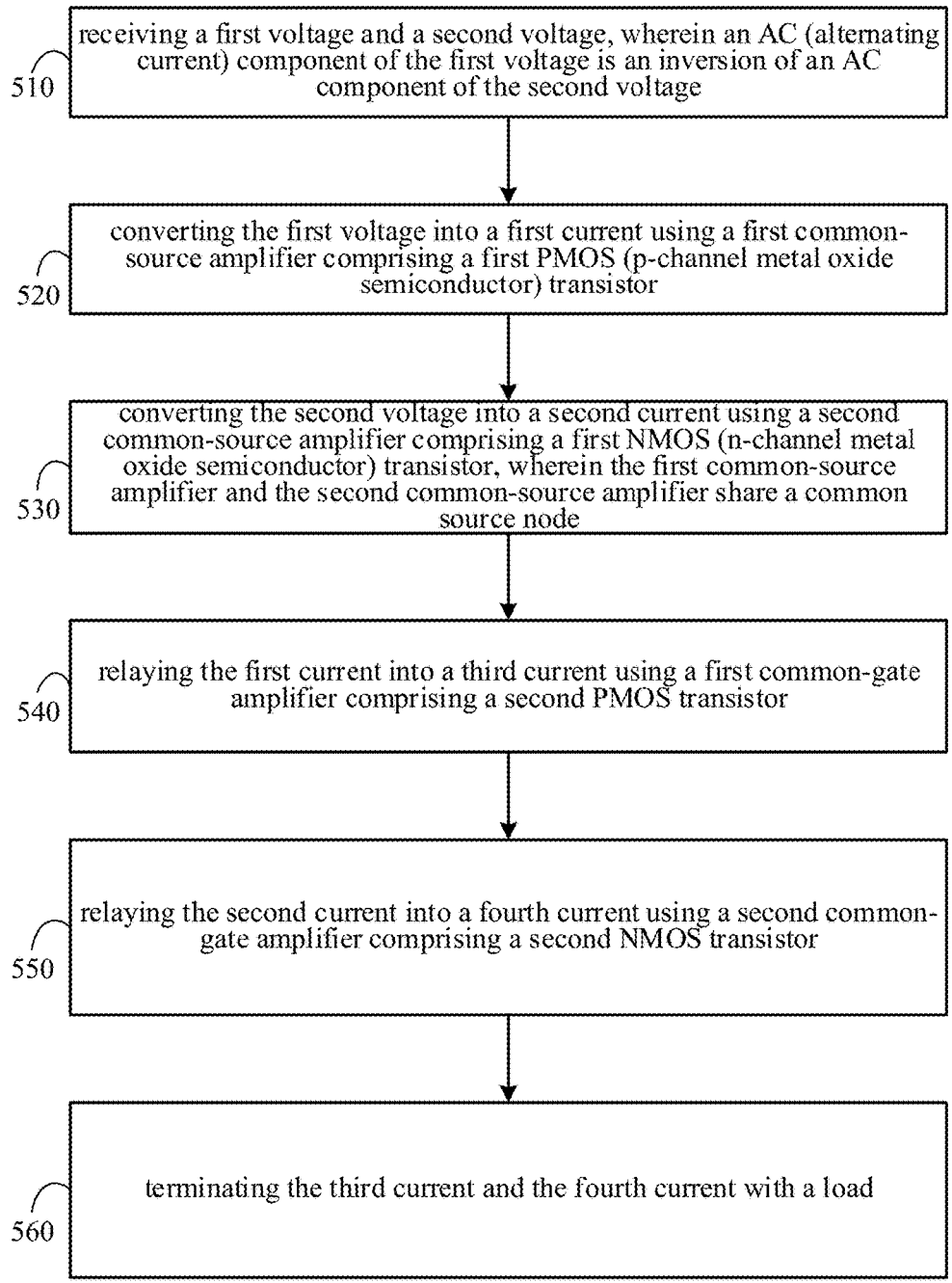
FIG. 5 shows a flow diagram of a method in accordance with the present invention.

As illustrated by a flow diagram shown in FIG. 5, a method comprises: (step 510) receiving a first voltage and a second voltage, wherein an AC (alternating current) component of the first voltage is an inversion of an AC component of the second voltage; (step 520) converting the first voltage into a first current using a first common-source amplifier comprising a first PMOS (p-channel metal oxide semiconductor) transistor; (step 530) converting the second voltage into a second current using a second common-source amplifier comprising a first NMOS (n-channel metal oxide semiconductor) transistor, wherein the first common-source amplifier and the second common-source amplifier share a common source node; (step 540) relaying the first current into a third current using a first common-gate amplifier comprising a second PMOS transistor; (step 550) relaying the second current into a fourth current using a second common-gate amplifier comprising a second NMOS transistor; and (step 560) terminating the third current and the fourth current with a load.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
   a first common-source amplifier comprising a first PMOS (p-channel metal oxide semiconductor) transistor configured to receive a first voltage and output a first current;
   a second common-source amplifier comprising a first NMOS (n-channel metal oxide semiconductor) transistor configured to receive a second voltage and output a second current, wherein the first common-source amplifier and the second common-source amplifier share a common source node, and an AC (alternating current) component of the first voltage is an inversion of an AC component of the second voltage;
   a first common-gate amplifier comprising a second PMOS transistor configured to receive the first current and output a third current;
   a second common-gate amplifier comprising a second NMOS transistor configured to receive the second current and output a fourth current; and
   a load configured to terminate the third current and the fourth current,
   wherein the load comprises a first inductor inserted between the drain of the second PMOS transistor and a ground node and the first inductor is directly connected to the ground node, and a second inductor inserted between the drain of the second NMOS transistor and a power node and the second inductor is directly connected to the power node.

2. The apparatus of claim 1 wherein the load further comprises a tuning capacitor configured to tune an impedance of the load.

3. The apparatus of claim 2, wherein: the gate of the second PMOS transistor is DC (direct-current) coupled to a first bias voltage; the gate of the second NMOS transistor is DC coupled to a second bias voltage; the source of the second NMOS transistor is AC coupled to the gate of the second PMOS transistor; and the source of the second PMOS transistor is AC coupled to the gate of the second NMOS transistor.

4. The apparatus of claim 2, wherein: the gate of the second PMOS transistor is DC (direct-current) coupled to a first bias voltage; the gate of the second NMOS transistor is DC coupled to a second bias voltage; the drain of the second NMOS transistor is AC coupled to the gate of the second PMOS transistor; and the drain of the second PMOS transistor is AC coupled to the gate of the second NMOS transistor.

5. An apparatus comprising:
   a first hybrid differential amplifier configured to receive a first input signal and a second input signal and output a first output signal and a second output signal using a first cascode amplifier and a second cascode amplifier, respectively; and
   a second hybrid differential amplifier configured to receive a third input signal and a fourth input signal and output a third output signal and a fourth output signal using a third cascode amplifier and a fourth cascode amplifier, respectively; wherein: the first cascode amplifier and the third cascode amplifier are based on using PMOS (p-channel metal oxide semiconductor) transistors, the second cascode amplifier and the fourth cascode amplifier are based on using NMOS (n-channel metal oxide semiconductor) transistors, a DC (direct current) component of the first input signal is the same as a DC component of the third input signal, a DC component of the second input signal is the same as a DC component of the fourth input signal, an AC (alternating current) component of the first input signal is the same as an AC component of the fourth input signal, an AC component of the second input signal is the same as an AC component of the third input signal, and the AC component of the second input signal is an inversion of the AC component of the first input signal.

6. The apparatus of claim 5 further comprising: a first load comprising a first inductor and a second inductor configured to provide a termination for the first output signal and the second output signal, respectively, and a second load comprising a third inductor and a fourth inductor configured to provide a termination for the third output signal and the fourth output signal, respectively.

7. The apparatus of claim 6 further comprising a power combining network comprising a fifth inductor, a sixth inductor, a seventh inductor, and an eighth inductor configured to have an inductive coupling with the first inductor, the second inductor, the third inductor, and the fourth inductor, respectively.

8. The apparatus of claim 7, wherein the fifth inductor, the sixth inductor, the seventh inductor, and the eighth inductor are connected in a way such their respective voltages are effectively summed.

9. The apparatus of claim 7, wherein the fifth inductor, the sixth inductor, the seventh inductor, and the eighth inductor are connected in a way such their respective currents are effectively summed.

10. A method comprising:
    receiving a first voltage and a second voltage, wherein an AC (alternating current) component of the first voltage is an inversion of an AC component of the second voltage;
    converting the first voltage into a first current using a first common-source amplifier comprising a first PMOS (p-channel metal oxide semiconductor) transistor;
    converting the second voltage into a second current using a second common-source amplifier comprising a first NMOS (n-channel metal oxide semiconductor) transistor, wherein the first common-source amplifier and the second common-source amplifier share a common source node;
    relaying the first current into a third current using a first common-gate amplifier comprising a second PMOS transistor;
    relaying the second current into a fourth current using a second common-gate amplifier comprising a second NMOS transistor; and
    terminating the third current and the fourth current with a load,
    wherein the load comprises a first inductor inserted between the drain of the second PMOS transistor and a ground node and the first inductor is directly connected to the ground node, and a second inductor inserted between the drain of the second NMOS transistor and a power node and the second inductor is directly connected to the power node.

11. The method of claim 10, wherein the load further comprises a tuning capacitor configured to tune an impedance of the load.

12. The method of claim 11, wherein: the gate of the second PMOS transistor is DC (direct-current) coupled to a first bias voltage; the gate of the second NMOS transistor is DC coupled to a second bias voltage; the source of the second NMOS transistor is AC coupled to the gate of the second PMOS transistor; and the source of the second PMOS transistor is AC coupled to the gate of the second NMOS transistor.

13. The method of claim 11, wherein: the gate of the second PMOS transistor is DC (direct-current) coupled to a first bias voltage; the gate of the second NMOS transistor is DC coupled to a second bias voltage; the drain of the second NMOS transistor is AC coupled to the gate of the second PMOS transistor; and the drain of the second PMOS transistor is AC coupled to the gate of the second NMOS transistor.

* * * * *